US008809168B2

(12) United States Patent
Bedell et al.

(10) Patent No.: US 8,809,168 B2
(45) Date of Patent: Aug. 19, 2014

(54) GROWING COMPRESSIVELY STRAINED SILICON DIRECTLY ON SILICON AT LOW TEMPERATURES

(75) Inventors: Stephen W. Bedell, Wappingers Falls, NY (US); Bahman Hekmatshoartabari, Mount Kisco, NY (US); Alexander Reznicek, Mount Kisco, NY (US); Devendra K. Sadana, Pleasantville, NY (US); Ghavam G. Shahidi, Pound Ridge, NY (US); Davood Shahrjerdi, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 724 days.

(21) Appl. No.: 13/037,944

(22) Filed: Mar. 1, 2011

(65) Prior Publication Data
US 2012/0205784 A1 Aug. 16, 2012

Related U.S. Application Data

(60) Provisional application No. 61/442,589, filed on Feb. 14, 2011.

(51) Int. Cl.
*H01L 21/20* (2006.01)
*H01L 29/02* (2006.01)

(52) U.S. Cl.
USPC .......................... 438/478; 438/474; 438/513

(58) Field of Classification Search
USPC .................................. 438/474–481, 510–513
See application file for complete search history.

(56) References Cited

U.S. PATENT DOCUMENTS

| 6,972,247 B2 | 12/2005 | Bedell |
| 7,772,097 B2 | 8/2010 | Tomasini et al. |
| 7,906,723 B2 * | 3/2011 | Korevaar et al. ............... 136/255 |

OTHER PUBLICATIONS

Toshihisa Kitagawa, et al. "Hydrogen-mediated low-temperature epitaxy of Si in plasma-enhanced chemical vapor deposition". Applied Surface Science 159-160 2 000. 30-34.
H.R. Moutinho, et al. "Influence of Substrate Temperature and Hydrogen Dilution Ratio on the Properties of Nanocrystalline Silicon . . . ," NREL/CP-520-33929.
Young-Bae Park, et al. "Remote Plasma Chemical Vapour deposition of silicon films at low temperature with H and He plasma gases". 1999 IOP Publishing Ltd.
C. R. Wronski and R. W. Collins "Properties of Si:H Mixed Amorphous Microcrystalline Phases".
Eaglesham et al., Effect of H on Si molecular-beam epitaxy, AIP, 1993.

* cited by examiner

*Primary Examiner* — Cuong Q Nguyen
(74) *Attorney, Agent, or Firm* — Louis J. Percello; Otterstedt, Ellenbogen & Kammer, LLP

(57) ABSTRACT

Compressively strained silicon is epitaxially grown directly onto a silicon substrate at low temperature using hydrogen to engineer the strain level. Hydrogen dilution may be varied during such growth to provide a strain gradient.

19 Claims, 4 Drawing Sheets

GROWING COMPRESSIVELY STRAINED SILICON DIRECTLY ON SILICON AT LOW TEMPERATURES

CROSS-REFERENCE TO RELATED APPLICATION

This patent application claims the benefit of U.S. Provisional Patent Application Ser. No. 61/442,589 filed on Feb. 14, 2011 and entitled "GROWING COMPRESSIVELY STRAINED SILICON DIRECTLY ON SILICON AT LOW TEMPERATURES." The disclosure of the aforementioned Provisional Patent Application Ser. No. 61/442,589 is expressly incorporated herein by reference in its entirety for all purposes.

FIELD OF THE INVENTION

The present invention relates to the physical sciences, and, more particularly, to epitaxial, compressively strained films, film deposition techniques and the like.

BACKGROUND OF THE INVENTION

Strained silicon is generally understood as a layer of silicon wherein the silicon atoms have been stretched beyond their normal interatomic distance. There are various forms of silicon that may be deposited on a substrate. These include amorphous silicon, microcrystalline silicon, and epitaxial silicon. The term "epitaxial" refers to the deposition of a crystalline silicon-containing material on a substrate such that the deposited layer follows the lattice constant of the substrate. Epitaxial growth of silicon directly on crystalline silicon is regarded as homo-epitaxy, wherein the epitaxially grown layer is lattice matched with the template and has no strain. Therefore, in order to apply strain, the template and the epitaxial film should not be lattice matched. Epitaxial deposition is heterotaxial if the lattice constant of the deposited layer is different from that of the substrate. Low temperature epitaxy of silicon using molecular beam epitaxy and plasma-enhanced chemical vapor deposition has been reported. Silicon can be deposited over a substrate or buffer layer of silicon germanium in order to stretch the links between deposited silicon atoms. The increased distance between silicon atoms may facilitate electron mobility, resulting in better performance of electrical or electro-optical components using this technology.

SUMMARY OF THE INVENTION

Principles of the invention provide techniques for growing compressively strained, epitaxial silicon directly on crystalline silicon at low temperatures. In one aspect, an exemplary method includes the steps of providing a substrate having a crystalline silicon surface in a chamber, introducing a silicon precursor into the chamber, introducing hydrogen into the chamber, and causing the silicon precursor to form a compressively strained, completely epitaxial silicon layer on the crystalline silicon surface of the substrate via plasma enhanced chemical vapor deposition by controlling plasma power density, substrate temperature, pressure within the chamber, and the hydrogen dilution ratio.

A further method includes providing a substrate having a crystalline silicon surface in a chamber. It further includes causing a silicon precursor to form a compressively strained, completely epitaxial silicon layer on the crystalline silicon surface of the substrate via plasma enhanced chemical vapor deposition by controlling plasma power density, substrate temperature, pressure within the chamber, and by introducing hydrogen and silicon precursor into the chamber in a sufficiently high hydrogen to silicon precursor ratio (hydrogen dilution ratio) that sufficient hydrogen is incorporated within the epitaxial silicon layer to cause compressive strain in the epitaxial silicon layer of at least 0.2%.

A product is provided by the invention and can be manufactured using the techniques described herein. The product comprises a substrate including a crystalline silicon surface and a compressively strained, completely epitaxial silicon layer adjoining the crystalline silicon surface at an interface and lattice matched thereto. The silicon layer includes sufficient hydrogen to cause a compressive strain of at least 0.2%.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a tangible computer readable recordable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s), or (iii) a combination of hardware and software modules; any of (i)-(iii) implement the specific techniques set forth herein, and the software modules are stored in a tangible computer-readable recordable storage medium (or multiple such media).

Techniques of the present invention can provide substantial beneficial technical effects. For example, one or more embodiments may provide one or more of the following advantages: 1) improving the electrical properties of a deposited silicon layer; 2) providing a scalable process that can be used for manufacturing electronic components in commercial quantities; 3) controlling compressive strain throughout a deposited layer such that the strain can be substantially uniform or graded, and 4) obviating the need for depositing a buffer layer such as SiGe on the substrate prior to silicon deposition.

These and other features and advantages of the present invention will become apparent from the following detailed description of illustrative embodiments thereof, which is to be read in connection with the accompanying drawings.

DETAILED DESCRIPTION OF PREFERRED EMBODIMENTS

A method is provided for growing a compressively strained silicon layer at low temperature directly on a crystalline silicon substrate. Using plasma enhanced chemical vapor deposition (PECVD), the method further provides for epitaxial growth in the absence of a buffer layer such that the deposited silicon layer is both epitaxial and compressively strained. Epitaxial growth occurs throughout the process such that the deposited silicon layer is epitaxial from its interface with the substrate to its outer surface. The compressive strain can be substantially uniform or graded. The hydrogen dilution ratio is employed for strain engineering. A product comprising a crystalline silicon substrate and a compressively strained, epitaxial silicon layer deposited directly on the substrate is further provided.

In a crystalline solid, atoms are arranged in a periodic order. The periodic and geometric arrangement of atoms is known as the lattice. When a semiconductor is grown epitaxially onto a crystalline template, it tends to conform to the crystalline structure of the template. The lattice constant denotes a length in a unit cell of a crystal lattice. If a grown layer is lattice matched to the substrate, the grown film will be strain free. If an epitaxially grown layer is not lattice matched to the substrate, it will be strained as its lattice structure conforms to that of the substrate. The degree of strain is proportional to the change in the lattice constant L of the deposited material, or $\Delta L/L$, which can be expressed as a percentage. The term "fully strained" refers to a strained epitaxially grown film whose in plane lattice constant conforms to that of the substrate. The compressive strain levels targeted by the exemplary methods discussed below are levels that effectively enhance hole transport properties of the deposited silicon.

Figure 1:
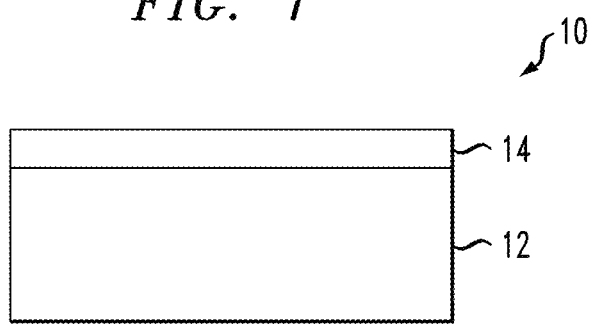
FIG. 1 is a sectional view showing a relaxed, crystalline silicon substrate having an epitaxial layer of compressively strained silicon thereon.
Figure 2:
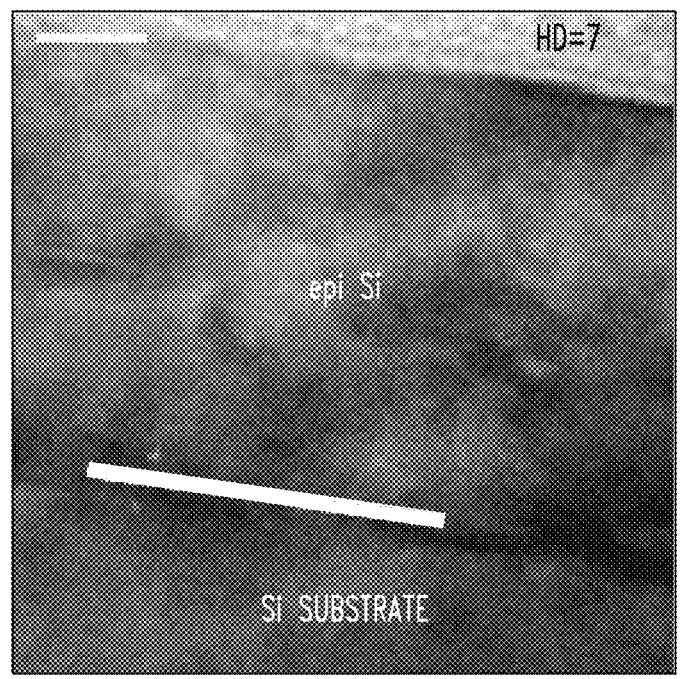
FIG. 2 is a view of a relaxed, crystalline silicon substrate having an epitaxially layer of compressively strained silicon thereon taken with a transmission electron microscope (TEM)

Referring to FIG. 1, a sectional view is provided of an exemplary wafer 10 manufactured pursuant to a method provided by the invention. The wafer includes a crystalline silicon substrate 12 and a compressively strained, epitaxial silicon layer 14 deposited directly thereon. It will be understood that the layer 14 can include elements in addition to silicon, but does not necessarily require such elements other than hydrogen in an amount sufficient to impart the desired strain. It will further be understood that the substrate does not need to be comprised entirely of crystalline silicon. It is only necessary that the surface upon which the silicon layer is formed be comprised of crystalline silicon. In this exemplary embodiment, the strain in the layer 14 is substantially uniform throughout and at least partially attributable to hydrogen atoms incorporated in the layer. FIG. 2 provides a view of part of the wafer 10 obtained using a transmission electron microscope, including a portion of the substrate 12 and deposited silicon layer 14. As shown, the deposited layer 14 is entirely epitaxial and lattice-matched to the substrate 12. No observable deviation from the in plane lattice constant of the substrate is present that would result in the formation of defects capable of causing the epitaxial layer to "relax".

In accordance with an exemplary embodiment of the invention, strained, epitaxial silicon is grown using radio-frequency (RF) plasma enhanced chemical vapor deposition (PECVD). As discussed above, a crystalline silicon substrate 12 is provided. The substrate has a crystalline surface for the direct deposition of silicon. The substrate is positioned in a chamber for processing. The silicon layer 14 can be grown using various gas sources such as silane ($SiH_4$), dichlorosilane (DCS), $SiF_4$ and $SiCl_4$ as precursors. The silicon precursor is introduced into the chamber. Temperature in the chamber, including the temperature of the substrate, is maintained below 300° C. and preferably between 150-250° C. The deposition pressure is maintained between 10 mtorr and 2 torr, preferably between 100-1500 mtorr. Plasma power density is less than 40 mW/cm2, more preferably less than 20 mW/cm2 and even more preferably less than 10 mW/cm2. Plasma power densities of 8 mW/cm2 and 16 mW/cm2 were found to be acceptable, the lower amount being preferred for the high quality growth of strained, epitaxial silicon.

Hydrogen is introduced into the chamber with the precursor gas. The hydrogen dilution ratio, which is the ratio of hydrogen to the precursor gas, e.g. $H_2:SiH_4$, is maintained at a level that will cause the epitaxially deposited silicon layer to have an effective, usable degree of strain. A compressive strain ($\Delta L/L$) of at least 0.2% and as much as about 1% (one percent) in the silicon layer 14 is targeted, depending on intended use of the resulting product. The hydrogen dilution ratio is used to engineer the degree of strain, either uniformly to provide a substantially uniformly strained silicon layer as shown in FIGS. 1 and 2 or to provide a strain gradient in the layer as discussed below with respect to FIGS. 4-6. The hydrogen dilution ratio is preferably at least 6 and in the range of 6-100. Silicon gas precursors may be provided by manufacturers in diluted form. In such cases, the hydrogen introduced to the chamber is provided at such a rate that the ratio of hydrogen to pure (non-diluted) silicon gas precursor is maintained in the specified range.

The operating parameters contribute to the effective formation of a silicon film that is entirely epitaxial and wherein the strain is controlled between the substrate interface and the exposed surface of the deposited silicon layer. Hydrogen is incorporated in the silicon as the film is deposited on the substrate. The low deposition temperature helps ensure against the escape of hydrogen from the film. The film growth rate is preferably maintained between 1-5 nm/minute. Higher strain is achieved at relatively lower deposition rates. The process is terminated when a film of preselected thickness has been formed. Assuming the deposition rate is known, the process can be terminated after a specified time has elapsed. Targeted film thickness depends on the particular application of the resulting product, and can range in exemplary embodiments from two nanometers to hundreds of nanometers. Film growth is epitaxial throughout this range.

Gases such as HCl and $Cl_2$ can be flown simultaneously with the precursor silicon-containing gas. These gases remove or etch amorphous or polycrystalline silicon and are used for the selective epitaxial growth of silicon over an insulator. Silicon grown on an insulator will be either amorphous or polycrystalline as there is no lattice to match. Since amorphous or polycrystalline silicon etches faster than crystalline silicon, by simultaneous or alternate flow of the above-mentioned gases with the processing gases required for the epitaxial growth of silicon, selective epitaxial growth of compressively strained silicon can be obtained. Gases such as argon and deuterium can also be flown simultaneously with the silicon precursor. If hydrogen is used to remove the amorphous or polycrystalline portion, it is flown in the absence of the silicon precursor gas.

The above-described method may include providing an element such as germanium or a dopant such as phosphorus, arsenic or boron for incorporation in the deposited silicon layer. Epitaxial SiGe films deposited on crystalline silicon will be strained due to the differences in lattice constants between the materials. This strain can be further engineered by adjusting the hydrogen dilution ratio. The method according to the invention can be used as a complementary process with other known procedures for providing compressive strains in epitaxially grown silicon films, though is not preferred at least with respect to the incorporation of germanium. Although the germanium will improve the hole transport properties, it will reduce the energy band gap and therefore increase the off current of the resulting electrical component. Compressive strain introduced through hydrogen does not cause the degree of reduction in the energy band gap associated with germanium.

Figure 3:
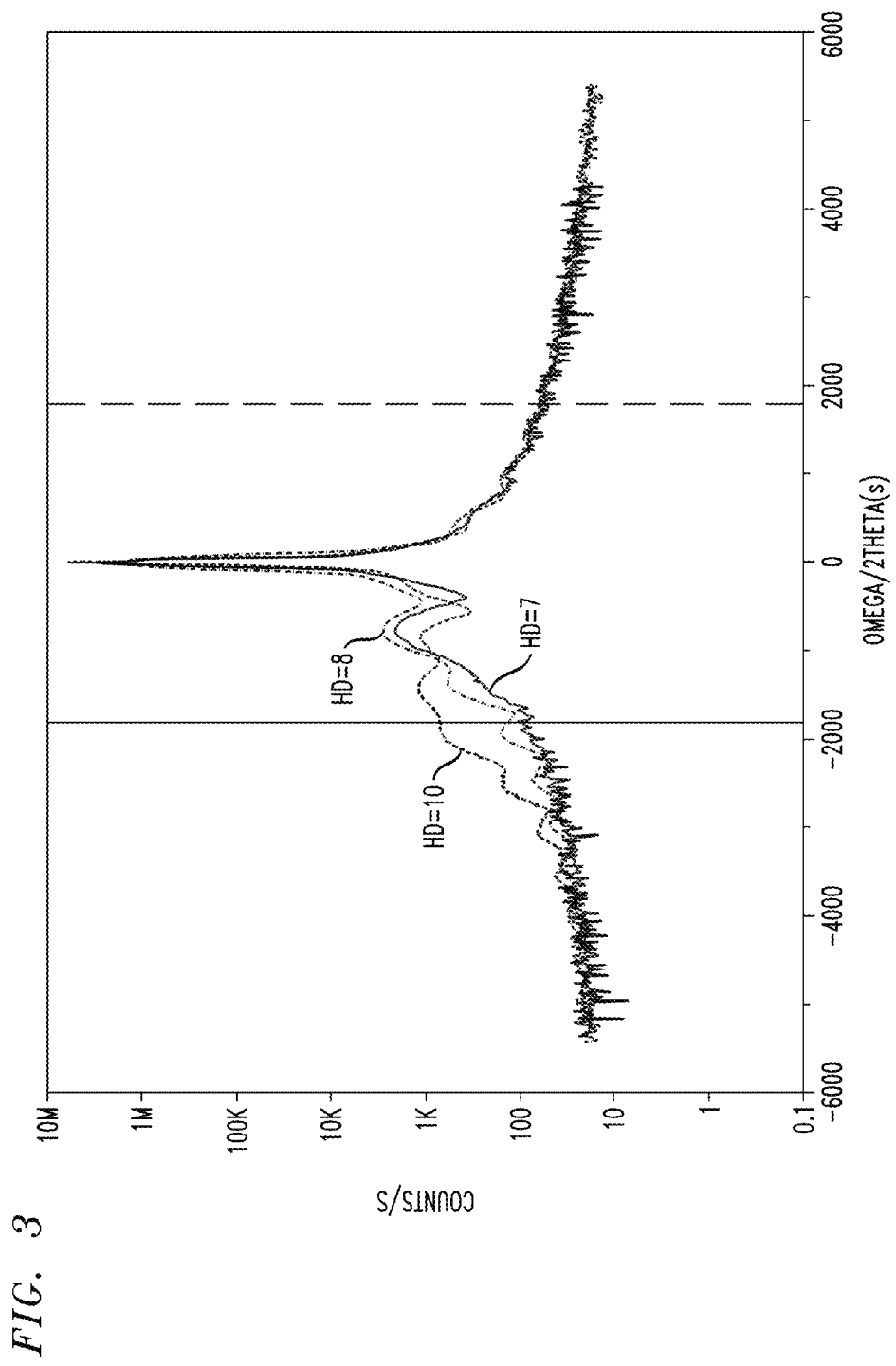
FIG. 3 is a graph showing x-ray data relating to epitaxial silicon layers grown directly on crystalline silicon substrates at 150° C. at various hydrogen dilution ratios.

FIG. 3 provides an exemplary illustration of the strain engineering that is possible by varying the hydrogen dilution ratio. The x-ray rocking curve analysis was carried out for three different dilution ratios, HD=7, HD=8 and HD=10 in order to evaluate the strain level in the layers. Using x-ray analysis it is possible to obtain information about the in-plane and out-of-plane lattice constants of the layers using Bragg's law. The main peak located at the Omega/2Theta=0° corresponds to the silicon substrates. It is evident from the x-ray data that increasing the hydrogen dilution ratio gives rise to stronger fringes, indicating higher strain level.

Figure 4:
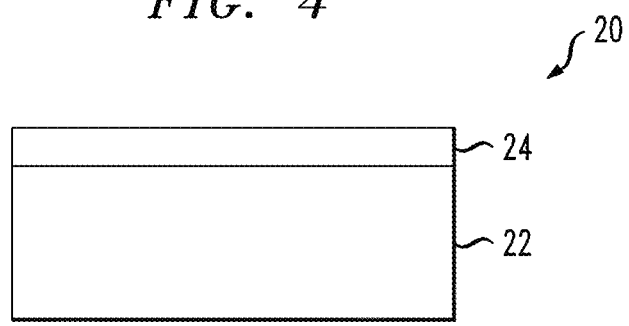
FIG. 4 is a sectional view showing a relaxed, crystalline silicon substrate having an epitaxial layer of compressively strained silicon thereon, the strain being graded.
Figure 5:
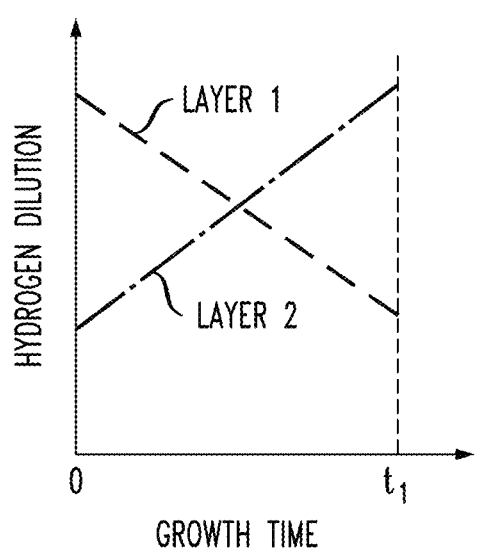
FIG. 5 is a graph illustrating the increase or decrease in the hydrogen dilution ratio over time as epitaxial layers are deposited.
Figure 6:
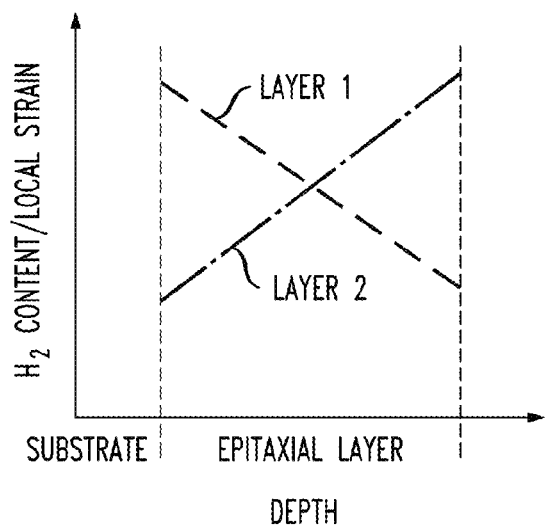
FIG. 6 is a graph illustrating the increase or decrease of hydrogen content and local strain with respect to the depth of the epitaxial layers formed in accordance with the processes shown in FIG. 5.

FIG. 4 shows a wafer 20 comprising a crystalline silicon substrate 22 and a strained, epitaxial silicon layer 24 directly deposited on the surface of the substrate. The strain level in the epitaxial silicon layer is graded in this embodiment by varying the hydrogen dilution level during growth of the layer. This is in contrast to the embodiment of FIG. 1 where the strain level is substantially the same throughout the epitaxial layer 14. All other process parameters preferably remain constant during such growth. The epitaxial layer may exhibit greater strain near the interface with the substrate than at its exposed surface or vice versa. The hydrogen incorporation results in the compressive strain. The strain level within the epitaxial layer can be gradually increased or decreased by gradual increase or decrease of the hydrogen dilution ratio during the epitaxial growth process. If designed for use in a MOSFET device, the manufacturer may prefer more compressive strain near the exposed surface of the epitaxial silicon layer than at the interface. If the process is to be followed by layer transfer, the compressive strain will preferably be greatest near the interface and decrease in the direction of the exposed surface FIG. 5 illustrates the process for forming epitaxial silicon layers with graded strain levels. In the case of LAYER 1, the hydrogen dilution ratio is steadily decreased during film deposition. The hydrogen dilution ratio steadily increases over time in forming LAYER 2 while other conditions (e.g. temperature, pressure, deposition rate) remain constant. As shown in FIG. 6, LAYER 1 has a decreasing hydrogen content and corresponding decreasing strain level between the silicon substrate and the outer surface of the layer. LAYER 2, which was epitaxially deposited under conditions of increasing hydrogen dilution over time, shows an increasing hydrogen content and corresponding increasing local strain between the surface of the substrate and the outer surface of the layer.

Compressively strained layers as provided herein can enhance hole transport properties as compared to non-strained silicon. They are suitable for applications whose operations are based on hole transport, and can therefore be employed in the manufacture of p-MOSFETS in CMOS technology. It will be appreciated that, following formation of the epitaxial, compressive strained silicon layer, further manufacturing steps may be performed.

Given the discussion thus far, it will be appreciated that, in general terms, an exemplary method, according to an aspect of the invention, includes the steps of providing a substrate having a crystalline silicon surface in a chamber, introducing a silicon precursor into the chamber, introducing hydrogen into the chamber, and causing the silicon precursor to form a compressively strained, completely epitaxial silicon layer on the crystalline silicon surface of the substrate via plasma enhanced chemical vapor deposition by controlling plasma power density, substrate temperature, pressure within the chamber, and the hydrogen dilution ratio.

A further exemplary method includes providing a substrate having a crystalline silicon surface in a chamber. It further includes causing a silicon precursor to form a compressively strained, completely epitaxial silicon layer on the crystalline silicon surface of the substrate via plasma enhanced chemical vapor deposition by controlling plasma power density, substrate temperature, pressure within the chamber, and by introducing hydrogen and silicon precursor into the chamber in a sufficiently high hydrogen to silicon precursor ratio (hydrogen dilution ratio) that sufficient hydrogen is incorporated within the epitaxial silicon layer to cause compressive strain in the epitaxial silicon layer of at least 0.2%.

A product is provided by the invention and can be manufactured using the techniques described herein. The product comprises a substrate including a crystalline silicon surface and a compressively strained, completely epitaxial silicon layer adjoining the crystalline silicon surface at an interface and lattice matched thereto. The silicon layer includes sufficient hydrogen to cause a compressive strain of at least 0.2%.

Exemplary System and Article of Manufacture Details

As will be appreciated by one skilled in the art, aspects of the present invention may be embodied as a system, method or computer program product (for example, to facilitate control of one or more process parameters). Accordingly, aspects of the present invention pertaining to such control may take the form of an entirely hardware approach, an entirely software approach (including firmware, resident software, microcode, etc.) or an approach combining software and hardware aspects that may all generally be referred to herein as a "circuit," "module" or "system." Furthermore, aspects of the present invention (for example, to facilitate control of one or more process parameters) may take the form of a computer program product embodied in one or more computer readable medium(s) having computer readable program code embodied thereon.

One or more aspects, or elements thereof, can be implemented in the form of an apparatus including a memory and at least one processor that is coupled to the memory and operative to perform exemplary method steps.

Figure 7:
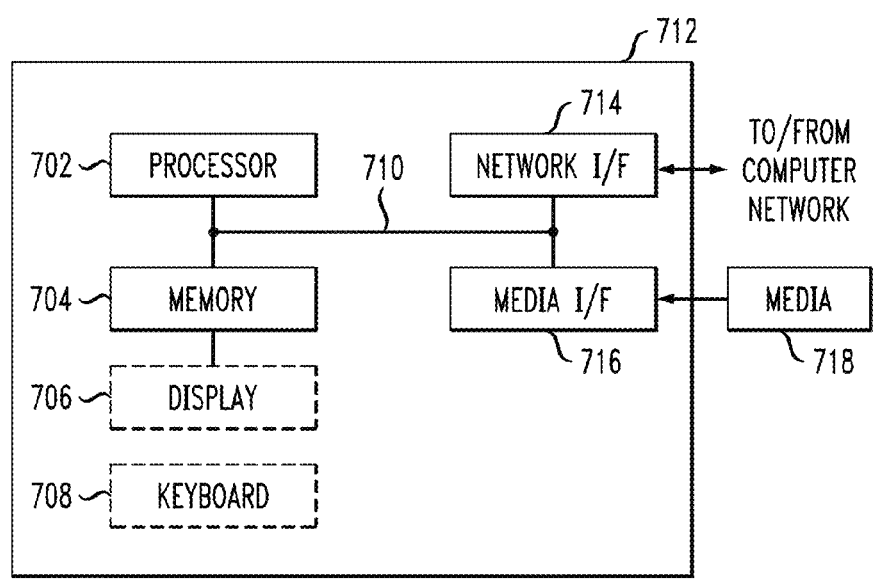
FIG. 7 depicts a computer system that may be useful in implementing one or more aspects and/or elements of the invention.

One or more aspects can make use of software running on a general purpose computer or workstation. With reference to FIG. 7 such an implementation might employ, for example, a processor 702, a memory 704, and an input/output interface formed, for example, by a display 706 and a keyboard 708. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 702, memory 704, and input/output interface such as display 706 and keyboard 708 can be interconnected, for example, via bus 710 as part of a data processing unit 712. Suitable interconnections, for example via bus 710, can also be provided to a network interface 714, such as a network card, which can be provided to interface with a computer network, and to a media interface 716, such as a diskette or CD-ROM drive, which can be provided to interface with media 718. An interface to one or more sensors and/or controllers for sensing and/or controlling process parameters or the like may be provided via a network interface or otherwise (e.g., A/D converter, D/A converter, and the like).

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 702 coupled directly or indirectly to memory elements 704 through a system bus 710. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including but not limited to keyboards 708, displays 706, pointing devices, and the like) can be coupled to the system either directly (such as via bus 710) or through intervening I/O controllers (omitted for clarity).

Network adapters such as network interface 714 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 712 as shown in FIG. 7) running a server program. It will be understood that such a physical server may or may not include a display and keyboard.

As noted, aspects of the present invention may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. Media block 718 is a non-limiting example. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Suitable computer program instructions (e.g., for process parameter sensing and/or control and the like) may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified.

It should be noted that any of the methods described herein can include an additional step of providing a system comprising distinct software modules embodied on a computer readable storage medium; the modules can include, by way of example and not limitation, an input/output module, a module to interface with sensors sensing one or more process parameters, a module to calculate any pertinent parameters to be derived from the sensed parameters, and a module to control one or more process parameters. The method steps can then be carried out using the distinct software modules and/or sub-modules of the system, as described above, executing on one or more hardware processors 702. Further, a computer program product can include a computer-readable storage medium with code adapted to be implemented to carry out or otherwise facilitate one or more method steps described herein (for example, by sensing and/or controlling one or more process parameters), including the provision of the system with the distinct software modules.

In any case, it should be understood that sensing and/or control aspects and the like may be implemented in various forms of hardware, software, or combinations thereof; for example, application specific integrated circuit(s) (ASICS), functional circuitry, one or more appropriately programmed general purpose digital computers with associated memory, and the like. Given the teachings of the invention provided herein, one of ordinary skill in the related art will be able to contemplate other implementations.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising:
providing a substrate having a crystalline silicon surface in a chamber;
introducing a silicon precursor into the chamber;
introducing hydrogen into the chamber;
causing the silicon precursor to form a compressively strained, completely epitaxial silicon layer having an exposed top surface and a preselected thickness on the crystalline silicon surface of the substrate via plasma enhanced chemical vapor deposition by controlling plasma power density, substrate temperature, pressure within the chamber, and the ratio of hydrogen to silicon precursor within the chamber, and
terminating the introduction of the silicon precursor and the hydrogen upon obtaining the preselected thickness of the compressively strained, completely epitaxial silicon layer.

2. The method of claim 1 wherein the ratio of hydrogen to silicon precursor is at least 6.

3. The method of claim 2 wherein the substrate temperature is between 150-250° C. and the compressively strained, completely epitaxial silicon layer is caused to form at a rate between 1-5nm/minute.

4. The method of claim 2 wherein the silicon precursor is gaseous silane.

5. The method of claim 2 wherein the plasma power density is less than 40mW/cm$^2$.

6. The method of claim 2 wherein the pressure is between 10mtorr and 2000mtorr.

7. The method of claim 6 wherein the pressure is between 100-1500mtorr.

8. The method of claim 2 further including the step of causing a graded compressive strain to be provided within the silicon layer by varying the ratio of hydrogen to silicon precursor while causing the silicon precursor to form the compressively strained, completely epitaxial silicon layer on the crystalline silicon surface of the substrate.

9. The method of claim 1 further including the step of causing a graded compressive strain to be provided within the silicon layer by varying the ratio of hydrogen to silicon precursor while causing the silicon precursor to form the compressively strained, completely epitaxial silicon layer on the crystalline silicon surface of the substrate.

10. The method of claim 9 further including the step of decreasing the ratio of hydrogen to silicon precursor while causing the silicon precursor to form the compressively strained, completely epitaxial silicon layer on the crystalline silicon surface of the substrate such that compressive strain in the epitaxial layer decreases with distance from the crystalline silicon surface.

11. The method of claim 9 further including the step of increasing the ratio of hydrogen to silicon precursor while causing the silicon precursor to form the compressively strained, completely epitaxial silicon layer on the crystalline silicon surface of the substrate such that compressive strain in the epitaxial layer increases with distance from the crystalline silicon surface.

12. The method of claim 1 wherein the ratio of hydrogen to silicon precursor is maintained at a sufficient level to cause compressive strain in the epitaxial silicon layer of at least 0.2%.

13. A method comprising:
providing a substrate having a crystalline silicon surface in a chamber;
causing a silicon precursor to form a compressively and substantially uniformly strained, completely epitaxial silicon layer having a preselected thickness and an exposed top surface on the crystalline silicon surface of the substrate via plasma enhanced chemical vapor deposition by controlling plasma power density, substrate temperature, pressure within the chamber, and by introducing hydrogen and silicon precursor into the chamber in a sufficiently high hydrogen to silicon precursor ratio that sufficient hydrogen is incorporated within the epitaxial silicon layer to cause compressive strain in the epitaxial silicon layer of at least 0.2%, and by terminating the introduction of hydrogen and silicon precursor into the chamber up obtaining the preselected thickness of the substantially uniformly strained, completely epitaxial silicon layer.

14. The method of claim 13 wherein the substrate temperature is less than 300° C.

15. The method of claim 14 wherein the compressively strained, completely epitaxial silicon layer is formed at a rate between 1-5nm/minute.

16. The method of claim 14 further including the step of decreasing the ratio of hydrogen to silicon precursor while causing the silicon precursor to form the compressively strained, completely epitaxial silicon layer on the crystalline silicon surface of the substrate such that compressive strain in the epitaxial layer decreases with distance from the crystalline silicon surface.

17. The method of claim 14 further including the step of increasing the ratio of hydrogen to silicon precursor while causing the silicon precursor to form the compressively strained, completely epitaxial silicon layer on the crystalline silicon surface of the substrate such that compressive strain in the epitaxial layer increases with distance from the crystalline silicon surface.

18. The method of claim 14 wherein the ratio of hydrogen to silicon precursor is at least 6.

19. The method of claim 12, further including the step of causing the compressive strain formed in the compressively strained, completely epitaxial silicon layer to be substantially uniform between an interface with the crystalline silicon surface and the exposed top surface.

* * * * *